United States Patent
Li et al.

(10) Patent No.: US 8,644,063 B2
(45) Date of Patent: Feb. 4, 2014

(54) FABRICATION AND INTEGRATION OF DEVICES WITH TOP AND BOTTOM ELECTRODES INCLUDING MAGNETIC TUNNEL JUNCTIONS

(71) Applicant: QUALCOMM Incorporated, San Diego, CA (US)

(72) Inventors: Xia Li, San Diego, CA (US); Seung H. Kang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 13/887,492

(22) Filed: May 6, 2013

(65) Prior Publication Data

US 2013/0244345 A1    Sep. 19, 2013

Related U.S. Application Data

(62) Division of application No. 12/627,173, filed on Nov. 30, 2009, now Pat. No. 8,455,965.

(51) Int. Cl.
*G11C 11/15* (2006.01)

(52) U.S. Cl.
USPC ........... 365/173; 365/171; 365/164; 365/158; 438/3; 438/618; 438/637; 257/421; 257/E21.665; 257/665; 257/295; 257/414

(58) Field of Classification Search
USPC .......... 257/421, E21.665, 295, 414, 422, 427; 438/3, 618, 637; 365/164, 158, 171, 365/173
See application file for complete search history.

(56) References Cited

U.S. PATENT DOCUMENTS

| | | | |
|---|---|---|---|
| 6,174,737 B1 | 1/2001 | Durlam et al. | |
| 6,239,896 B1 * | 5/2001 | Ikeda | 359/240 |
| 6,746,875 B2 * | 6/2004 | Okazawa et al. | 438/3 |
| 6,806,096 B1 | 10/2004 | Kim et al. | |
| 7,009,266 B2 | 3/2006 | Shi et al. | |

(Continued)

FOREIGN PATENT DOCUMENTS

| | | |
|---|---|---|
| EP | 1054449 A2 | 11/2000 |
| EP | 1248305 A2 | 10/2002 |

(Continued)

OTHER PUBLICATIONS

International Search Report and Written Opinion—PCT/US2010/058445, ISA/EPO—Jun. 1, 2011.

(Continued)

*Primary Examiner* — Telly Green
(74) *Attorney, Agent, or Firm* — Sam Talpalatsky; Nicholas J. Pauley; Joseph Agusta

(57) ABSTRACT

An electronic device manufacturing process includes depositing a bottom electrode layer. Then an electronic device is fabricated on the bottom electrode layer. Patterning of the bottom electrode layer is performed after fabricating the electronic device and in a separate process from patterning a top electrode. A first dielectric layer is then deposited on the electronic device and the bottom electrode layer followed by a top electrode layer. The top electrode is then patterned in a separate process from the bottom electrode. Separately patterning the top and bottom electrodes improves yields by reducing voids in the dielectric material between electronic devices. One electronic device the manufacturing process is well-suited for is magnetic tunnel junctions (MTJs).

16 Claims, 10 Drawing Sheets

(56) References Cited

U.S. PATENT DOCUMENTS

| | | | |
|---|---|---|---|
| 7,112,861 B2* | 9/2006 | Kanakasabapathy et al. | 257/421 |
| 7,122,386 B1* | 10/2006 | Torng et al. | 438/3 |
| 7,811,879 B2 | 10/2010 | Lam et al. | |
| 8,138,562 B2* | 3/2012 | Mao | 257/421 |
| 2003/0073253 A1* | 4/2003 | Okazawa et al. | 438/3 |
| 2005/0048674 A1 | 3/2005 | Shi et al. | |
| 2005/0254180 A1* | 11/2005 | Kanakasabapathy et al. | 360/324.2 |
| 2006/0022237 A1* | 2/2006 | Byun et al. | 257/295 |
| 2006/0211198 A1* | 9/2006 | Horng et al. | 438/257 |
| 2007/0023806 A1 | 2/2007 | Gaidis et al. | |
| 2008/0016675 A1* | 1/2008 | Byun et al. | 29/603.18 |
| 2008/0225576 A1* | 9/2008 | Zhong et al. | 365/158 |
| 2008/0314736 A1* | 12/2008 | Biskeborn et al. | 204/192.1 |
| 2009/0261433 A1* | 10/2009 | Kang et al. | 257/421 |
| 2009/0286368 A1 | 11/2009 | Lam et al. | |
| 2011/0089507 A1* | 4/2011 | Mao | 257/421 |
| 2011/0121417 A1 | 5/2011 | Li et al. | |
| 2011/0127626 A1 | 6/2011 | Li et al. | |

FOREIGN PATENT DOCUMENTS

| | | |
|---|---|---|
| EP | 1463110 A2 | 9/2004 |
| TW | 200733105 | 9/2007 |
| TW | 200802367 A | 1/2008 |

OTHER PUBLICATIONS

Magnetic memory (MRAM) technology development and applied prospectively, DTF 2008 Embedded World, (Oct. 22, 2008), http://www.digitimes.com.tw/tw/B2B/Seminar/Service/download/0519701220/dtf970122-2ITRI.pdf.

Taiwan Search Report—TW099141604—TIPO—May 15, 2013.

* cited by examiner

PARALLEL MAGNETIZATION LOW RESISTANCE ($R_0$) STATE "0"

ANTIPARALLEL MAGNETIZATION HIGH RESISTANCE ($R_1$) STATE "1"

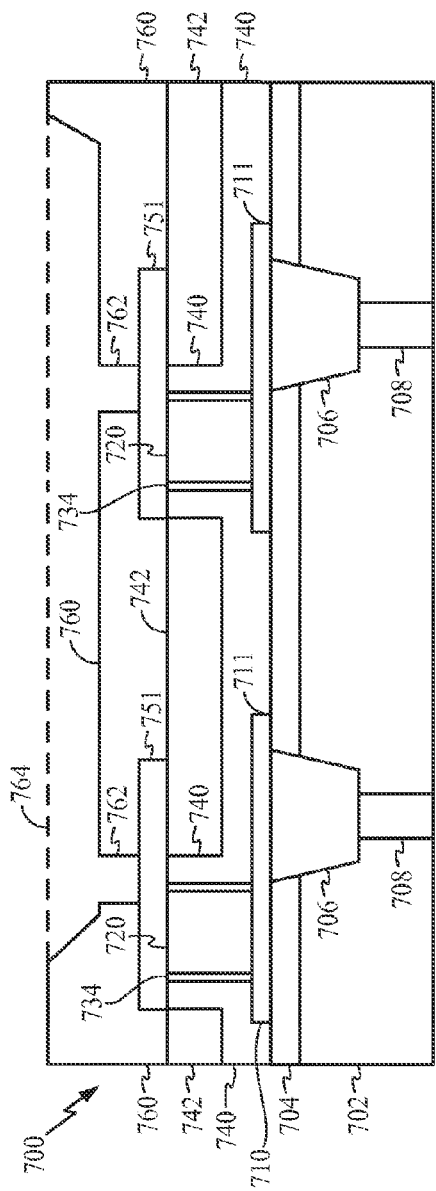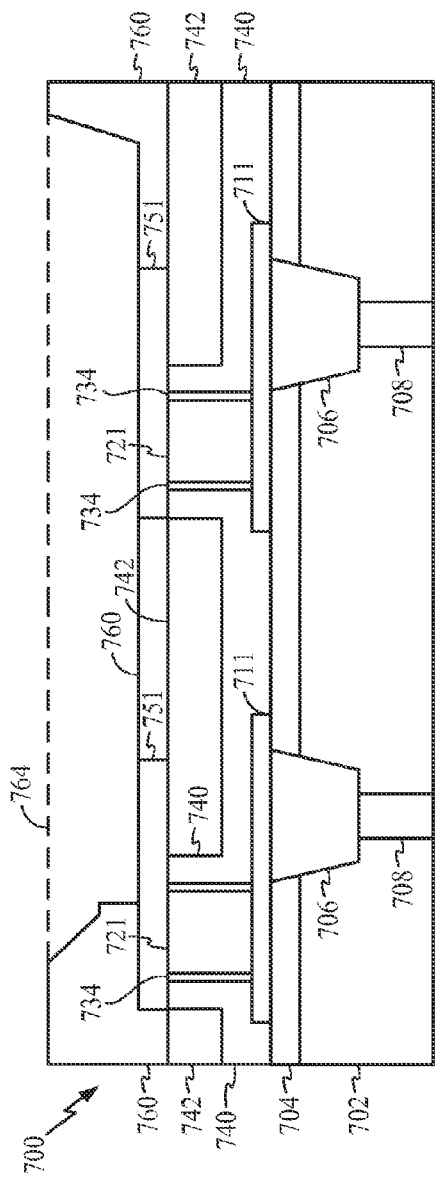

FABRICATION AND INTEGRATION OF DEVICES WITH TOP AND BOTTOM ELECTRODES INCLUDING MAGNETIC TUNNEL JUNCTIONS

CROSS REFERENCE TO RELATED APPLICATIONS

This application is a divisional application of U.S. patent application Ser. No. 12/627,173 filed on Nov. 30, 2009, entitled "FABRICATION AND INTEGRATION OF DEVICES WITH TOP AND BOTTOM ELECTRODES INCLUDING MAGNETIC TUNNEL JUNCTIONS" in the names of Xia Li et al., and assigned to a common assignee, the disclosure of which is expressly incorporated by reference herein in its entirety.

TECHNICAL FIELD

The present disclosure generally relates to manufacturing of electronic devices. More specifically, the present disclosure relates to manufacturing processes for magnetic tunnel junctions in magnetic random access memory.

BACKGROUND

Unlike conventional random access memory (RAM) chip technologies, in magnetic RAM (MRAM) data is not stored as electric charge, but is instead stored by magnetic polarization of storage elements. The storage elements are formed from two ferromagnetic layers separated by an insulating layer. One of the two layers has at least one pinned magnetic polarization (or fixed layer) set to a particular polarity by an anti-ferromagnetic layer (AFM). The magnetic polarity of the other magnetic layer (or free layer) is altered to represent either a "1" (i.e., anti-parallel polarity) or "0" (i.e., parallel polarity). One such device having a fixed layer, an insulating layer, and a free layer is a magnetic tunnel junction (MTJ). The electrical resistance of an MTJ is dependent on the magnetic polarity of the free layer compared to the magnetic polarity of the fixed layer. A memory device such as MRAM is built from an array of individually addressable MTJs.

FIG. 4A is a block diagram illustrating a spin-torque transfer (STT) magnetic tunnel junction in a low resistance state. A magnetic tunnel junction (MTJ) 400 includes a fixed layer 402 stacked with a tunnel barrier 404 and a free layer 406. A magnetic polarization of the fixed layer 402 is pinned in one direction by an anti-ferromagnetic layer (AFM) (not shown). A magnetic polarization of the free layer 406 is free to change between parallel and anti-parallel states. A resistance of the MTJ 400 depends, in part, on the magnetic polarization of the free layer 406. For example, when the magnetic polarization of the free layer 406 and the fixed layer 402 are substantially aligned, the MTJ 400 has a low resistance. The other stable state of the free layer 406 is examined in FIG. 4B.

FIG. 4B is a block diagram illustrating a spin-torque transfer (STT) magnetic tunnel junction in a high resistance state. For example, the magnetic polarization of the free layer 406 and the magnetic polarization of the fixed layer 402 are in substantially opposite directions. In this case, the MTJ 400 has a high resistance.

MRAM is a non-volatile memory device in which data is stored as a magnetic polarity of the free layer. Read and write speed of MRAM is faster than NAND flash memory. As cell sizes shrink and densities increase, yields and process margin of conventional manufacturing processes decrease, resulting in an increase in cost per die or potential reliability issues with the MRAM. One cause of MRAM failure is electrical shorting between neighboring conductors.

A bottom electrode and a top electrode in an MRAM bitcell can be etched during the same manufacturing process to save costs. After etching the top and bottom electrodes to form individual cells, a dielectric is deposited to fill the space between cells. As cells are spaced closer together to reach higher densities, the aspect ratio of the opening (depth of the opening divided by width of the opening) between cells increases. Dielectric deposition techniques such as chemical vapor deposition (CVD) or physical vapor deposition (PVD) are unable to completely fill large aspect ratio spaces leading to voids in the dielectric layer. If filled with conductive material, the voids may lead to unintentional electrical shorting of conductors later in processing.

The shorting is now described in more detail referencing FIG. 3. FIG. 3 is a top-down view of an array of magnetic tunnel junctions. An array 300 of magnetic tunnel junctions 334 includes top conductors 320 (for example manufactured as trenches). An individual MTJ 334 may be accessed by coupling the top conductor 320 to the desired individual MTJ 334 through top electrodes 332. As discussed above, during manufacturing, voids may form in the dielectric layer between the top electrodes 332 and the top conductors 320. During deposition of the top conductor material, the conducting material may fill the void resulting in a short 340 between top conductors 320. The short 340 may result in failure of the array 300. Thus, manufacturing yield decreases.

Conventionally, the number of shorts 340 are reduced by increasing a height of a top via (not shown) coupled between the top electrode 332 and the top conductor 320. The top via is manufactured taller than the height of the void to prevent overlap of the void and the top conductor 320, preventing the shorts from occurring. The height of the via is defined, in part, by each generation of technology. Because technology is scaled by 70% for each new generation, the height of the via is significantly reduced at each new generation. Process yields may suffer as the shorting issue increases at new generations.

SUMMARY

According to one aspect of the disclosure, an electronic device manufacturing process includes depositing a first electrode layer. The process also includes fabricating a magnetic device on the first electrode layer. The process further includes patterning the first electrode layer after fabricating the magnetic device. The process also includes depositing a first dielectric layer on the magnetic device and the first electrode layer after patterning the first electrode layer. The process further includes depositing a second electrode layer after depositing the first dielectric layer. The process also includes patterning the second electrode layer after depositing the second electrode layer.

According to another aspect of the disclosure, an electronic device includes a substrate. The electronic device also includes a first contact embedded in the substrate. The electronic device further includes a patterned first electrode on the substrate and coupled to the first contact. The electronic device also includes a patterned electronic device on the patterned first electrode. The electronic device further includes a patterned second electrode on the patterned electronic device. The electronic device also includes a trench contacting the patterned second electrode.

According to yet another aspect of the disclosure, an electronic device includes a substrate, and means for magnetically storing states. Each magnetic storing means is coupled between a first electrode and a second electrode. The electronic device further includes a dielectric substantially filling space between the first electrode, the second electrode, and adjacent magnetic storing means. The electronic device also includes means for coupling to the second electrode a surface of the magnetic storing means.

The foregoing has outlined rather broadly the features and technical advantages of the present disclosure in order that the detailed description that follows may be better understood. Additional features and advantages will be described hereinafter which form the subject of the claims of the disclosure. It should be appreciated by those skilled in the art that the conception and specific embodiments disclosed may be readily utilized as a basis for modifying or designing other structures for carrying out the same purposes of the present disclosure. It should also be realized by those skilled in the art that such equivalent constructions do not depart from the technology of the disclosure as set forth in the appended claims. The novel features which are believed to be characteristic of the disclosure, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

FIGS. 7A-7H are cross-sectional views illustrating various states of an exemplary electronic device during the manufacturing process.

DETAILED DESCRIPTION

The processes disclosed below allow fabrication of electronic devices having reduced risk of electrical shorting that reduces process yield. For example, magnetic tunnel junctions may be fabricated by the processes in a magnetic random access memory. Electronic devices manufactured by the processes disclose may be employed in wireless networks.

Figure 1:
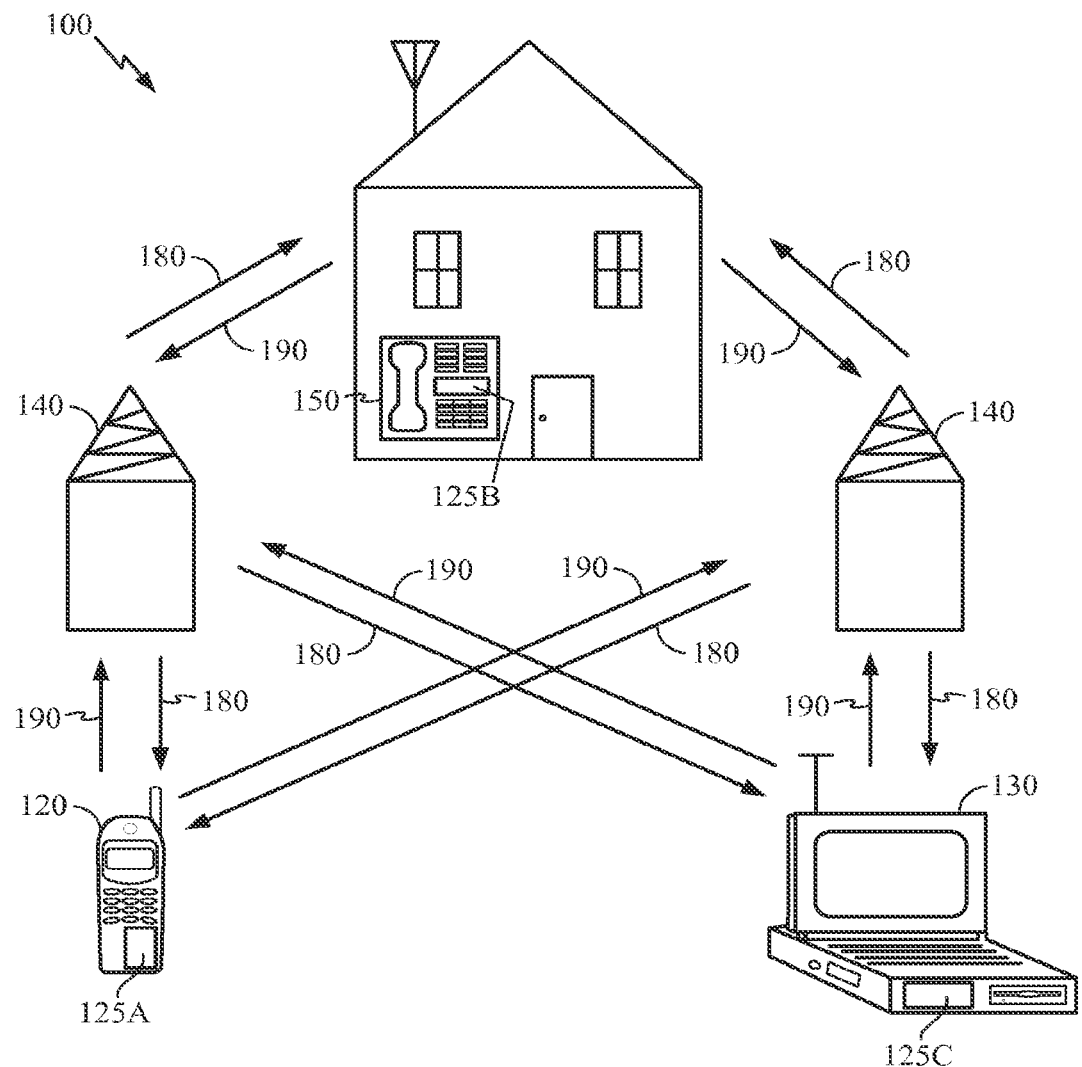
FIG. 1 is a block diagram showing an exemplary wireless communication system in which an embodiment of the disclosure may be advantageously employed.

FIG. 1 is a block diagram showing an exemplary wireless communication system 100 in which an embodiment of the disclosure may be advantageously employed. For purposes of illustration, FIG. 1 shows three remote units 120, 130, and 150 and two base stations 140. It will be recognized that wireless communication systems may have many more remote units and base stations. Remote units 120, 130, and 150 include magnetic tunnel junction (MTJ) devices 125A, 125B and 125C, as disclosed below. It will be recognized that any device containing a magnetic tunnel junction may also include semiconductor components having the disclosed features and/or components manufactured by the processes disclosed here, including the base stations, switching devices, and network equipment. FIG. 1 shows forward link signals 180 from the base station 140 to the remote units 120, 130, and 150 and reverse link signals 190 from the remote units 120, 130, and 150 to base stations 140.

In FIG. 1, the remote unit 120 is shown as a mobile telephone, the remote unit 130 is shown as a portable computer, and the remote unit 150 is shown as a fixed location remote unit in a wireless local loop system. For example, the remote units may be a device such as a music player, a video player, an entertainment unit, a navigation device, a communications device, a personal digital assistant (PDA), a fixed location data unit, and a computer. Although FIG. 1 illustrates remote units according to the teachings of the disclosure, the disclosure is not limited to these exemplary illustrated units. The disclosure may be suitably employed in any device which includes MTJ components, as described below. Although this is described for MTJ devices, the present disclosure also contemplates other electronic devices.

Figure 2:
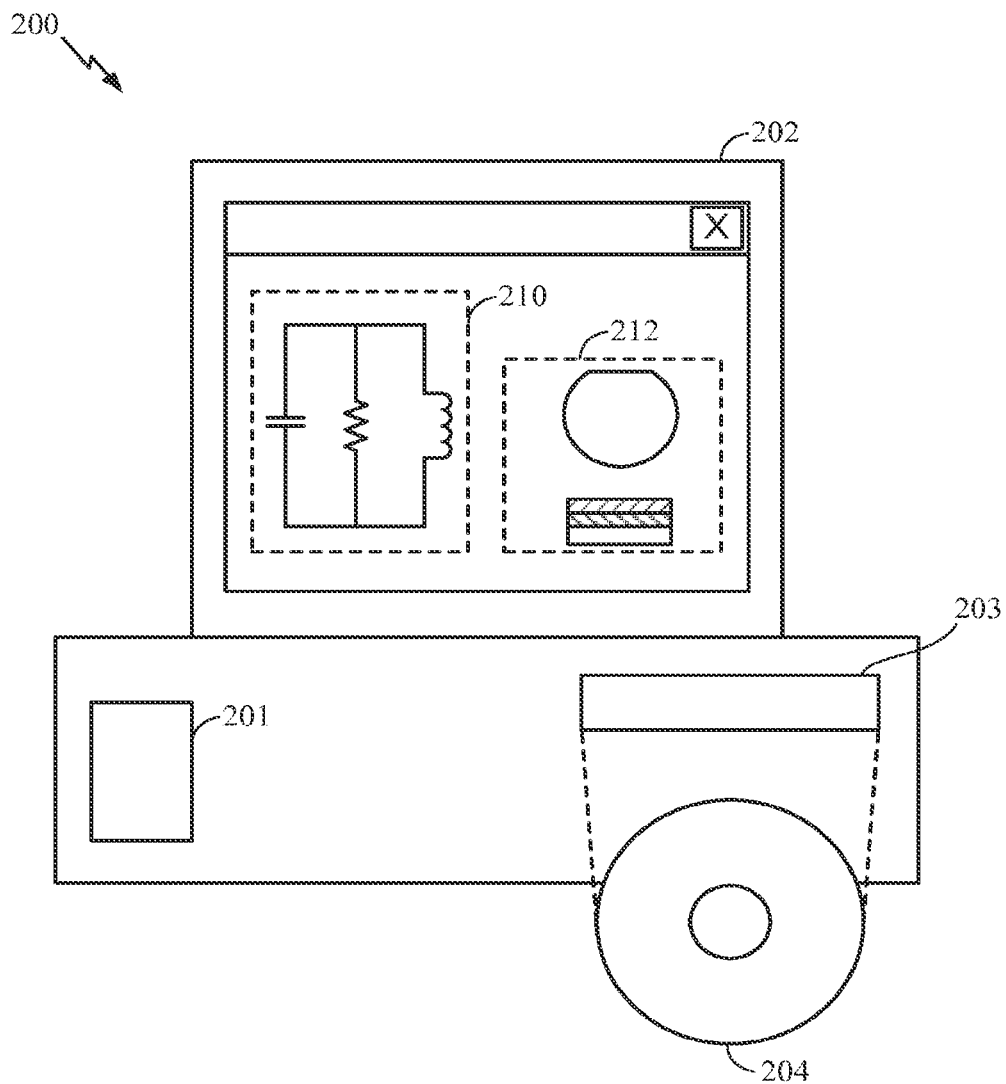
FIG. 2 is a block diagram illustrating a design workstation used for circuit, layout, and logic design of the disclosed semiconductor IC package.
Figure 3:
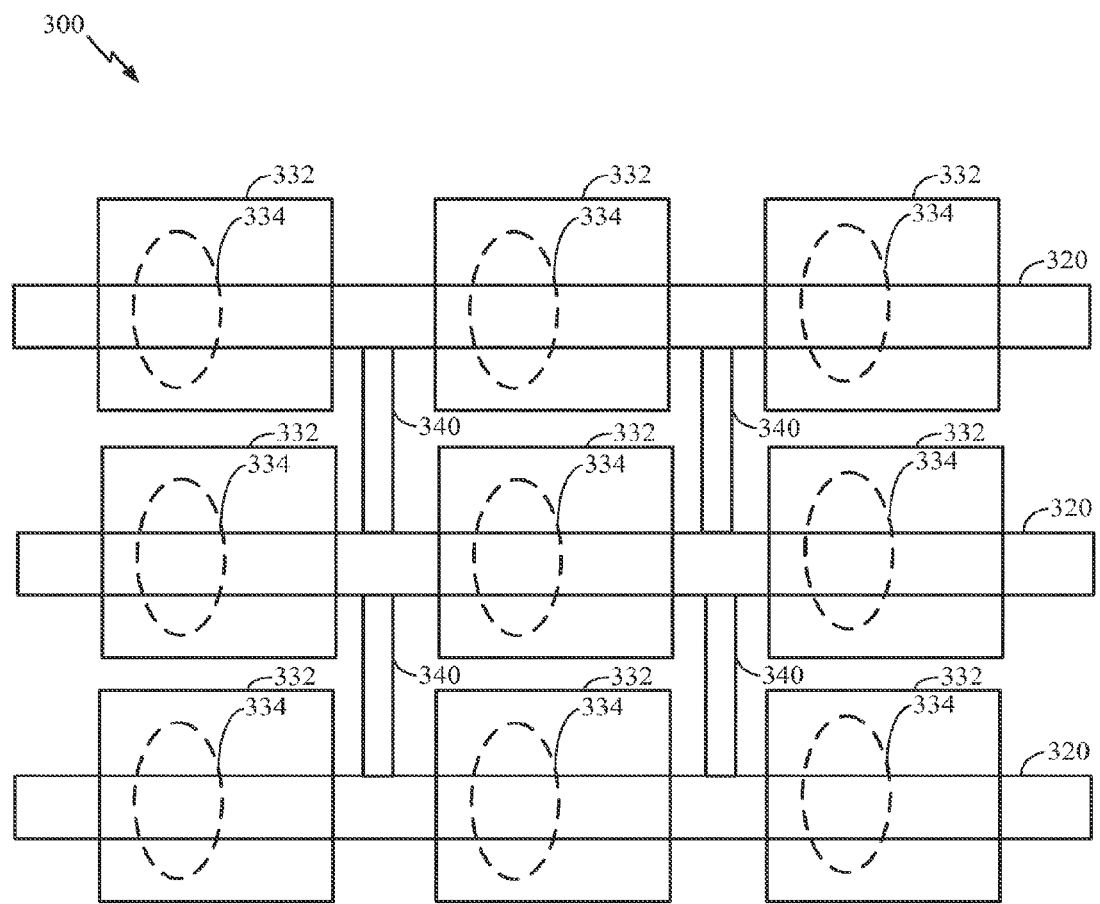
FIG. 3 is a top-down view of a conventional array of magnetic tunnel junctions.
Figures 4A, 4B:
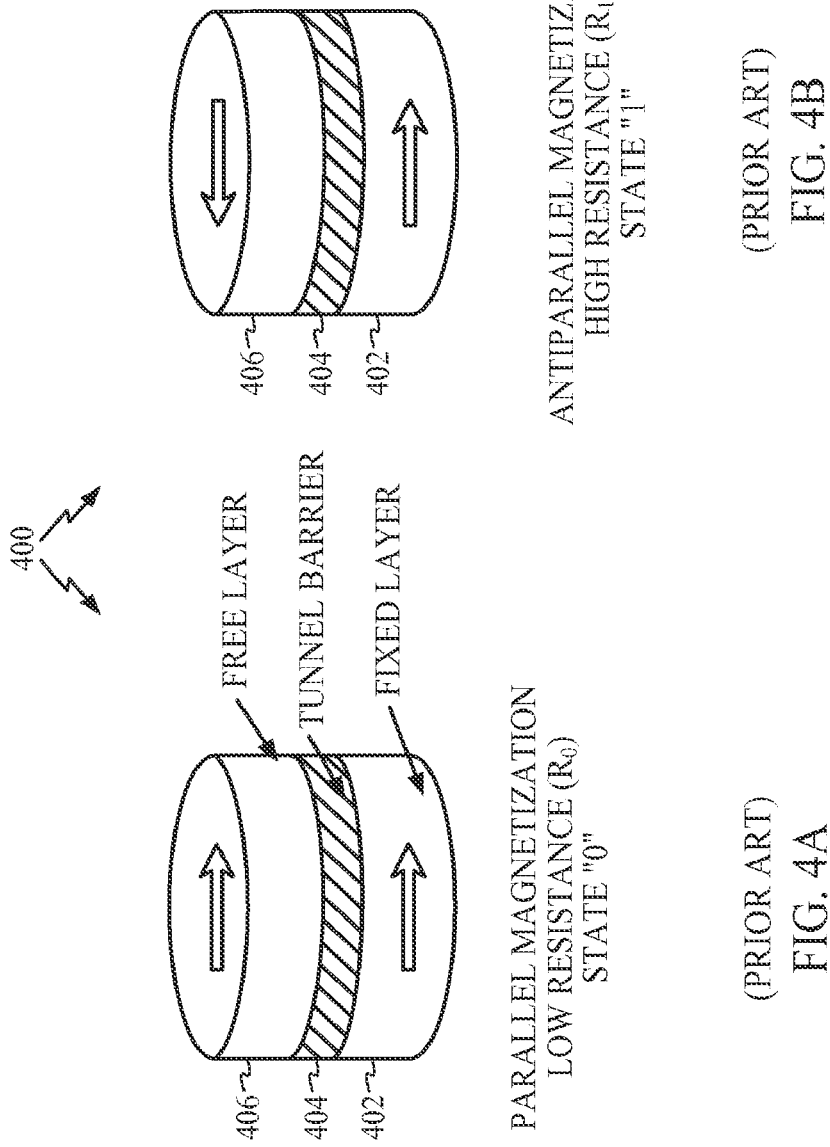
FIG. 4A is a block diagram illustrating a conventional magnetic tunnel junction in a low resistance state.
FIG. 4B is a block diagram illustrating a conventional magnetic tunnel junction in a high resistance state.

FIG. 2 is a block diagram illustrating a design workstation used for circuit, layout, logic, wafer, die, and layer design of a semiconductor part as disclosed below. A design workstation 200 includes a hard disk 201 containing operating system software, support files, and design software such as Cadence or OrCAD. The design workstation 200 also includes a display to facilitate manufacturing of a semiconductor part 210 that may include a circuit, a semiconductor wafer, a semiconductor die, or layers contained within a semiconductor wafer or semiconductor die. A storage medium 204 is provided for tangibly storing the semiconductor part 210. The semiconductor part 210 may be stored on the storage medium 204 in a file format such as GDSII or GERBER. The storage medium 204 may be a CD-ROM, DVD, hard disk, flash memory, or other appropriate device. Furthermore, the design workstation 200 includes a drive apparatus 203 for accepting input from or writing output to the storage medium 204.

Data recorded on the storage medium 204 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 204 facilitates the design of the semiconductor part 210 by decreasing the number of processes for manufacturing circuits, semiconductor wafers, semiconductor dies, or layers contained within a semiconductor wafer or semiconductor die.

Examples of electronic devices with a top electrode and bottom electrode on opposing sides of the electronic device include, for example, magnetic tunnel junctions and giant magnetoresistive devices. Magnetic tunnel junctions (MTJs) are used in magnetic random access memory (MRAM) as data storage elements. In one embodiment, an MTJ includes a free layer, a tunnel barrier layer, and a fixed layer. The free layer magnetic moment may be parallel or anti-parallel to the fixed layer magnetic moment, to represent a "1" or a "0". The magnetic moment of a ferromagnetic layer may be pinned with an anti-ferromagnetic layer (AFM). In another embodiment, multiple AFM layers are coupled to the free and the fixed layer.

Figure 5:
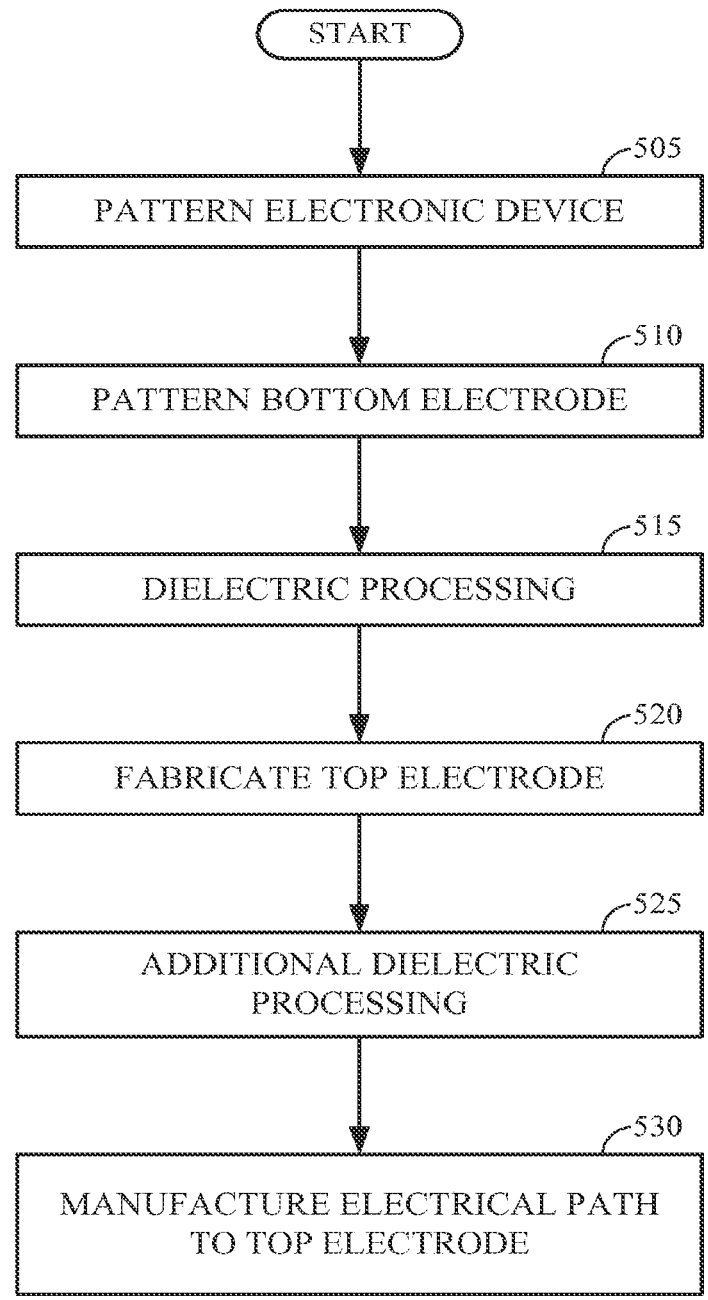
FIG. 5 is a flow chart illustrating an exemplary manufacturing process for an electronic device with top and bottom electrodes on a die and/or wafer according to one embodiment.

FIG. 5 is a flow chart illustrating an exemplary manufacturing process for an electronic device with top and bottom electrodes on a die and/or wafer according to one embodiment. At block 505 an electronic device is patterned using a first mask on a die and/or wafer. At block 510 a bottom electrode is patterned using a second mask on the die and/or wafer. At block 515, a dielectric film is deposited to conformally coat the die and/or wafer including the electronic device and the bottom electrode. A large space exists between devices because no top electrode has been placed on the electronic device. Thus, the dielectric layer is able to substantially fill space between devices without leaving a void. The dielectric layer is etched back or chemical mechanical polished and planarized to a level similar to atop surface of the electronic device. That is, the top surface of the electronic device is exposed to allow contact with a top electrode.

At block 520, a top electrode is deposited as a conformal conducting layer on the planarized dielectric. The top electrode is patterned to form individual top electrodes. In a two mask process, the top electrode may be patterned using the same mask previously employed to pattern the bottom electrode. In a three mask process, a third mask patterns the top electrode. In the event a bottom via is used, the bottom via mask may be reused to pattern the top and/or bottom electrode.

At block 525, a second dielectric film is deposited and planarized. At block 530, electrical paths are patterned into the second dielectric film. The electrical paths may be vias and/or trenches that allow contact with the top electrode. The electrical paths may be filled with a conducting material such as copper, aluminum, or an alloy.

Contacts to the top electrode manufactured according to this approach have a significantly reduced likelihood of shorting the electronic device. The inter-metal dielectric layer substantially fills the space between electronic devices leaving a small or no gap, which may be filled during electrical path formation. Thus, trenches may directly contact the top electrode without causing an electrical short of the electronic device.

Electronic devices manufactured according to this approach have a significantly reduced likelihood of shorting electrical paths. The inter-metal dielectric layer substantially fills the space between electronic devices leaving little or no gap. Thus, trenches may directly contact the top electrode without likelihood of trenches shorting to other trenches.

The flow chart illustrated in FIG. 5 may be adapted for processing different electrical devices. Turning now to FIGS. 6 and 7A-7H, an exemplary manufacturing process for magnetic tunnel junctions (MTJs) will be described.

Figure 6:
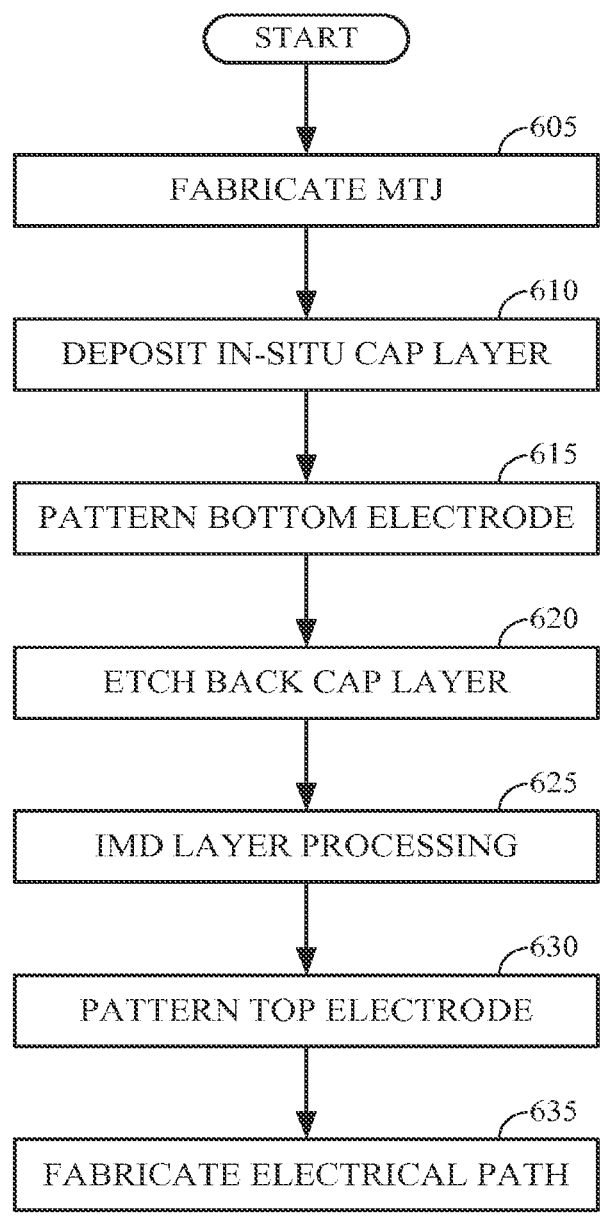
FIG. 6 is a flow chart illustrating an exemplary manufacturing process for a magnetic tunnel junction with top and bottom electrodes according to one embodiment.

FIG. 6 is a flow chart illustrating an exemplary manufacturing process fir a magnetic tunnel junction with top and bottom electrodes according to one embodiment. FIGS. 7A-7H are cross-sectional views illustrating various states of an exemplary electronic device during the manufacturing process. The process disclosed may be applied to a single electronic device, a die having many electronic devices, or a wafer having multiple dies of electronic devices.

Figure 7A:
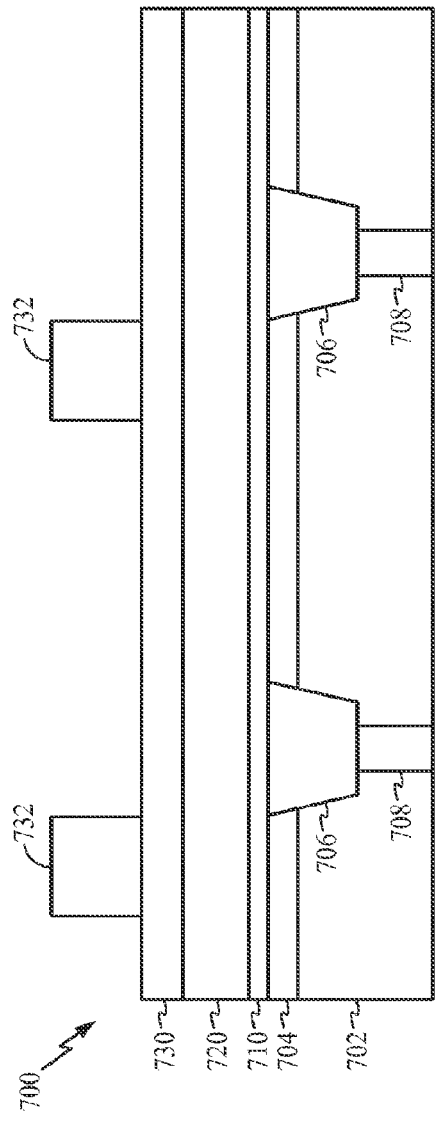

At block 605, an MTJ is fabricated as illustrated in FIG. 7A. A die and/or wafer 700 has an inter-layer or inter-metal dielectric substrate 702, which includes vias 708 and contacts 706 for coupling to a bottom electrode layer 710. An isolation layer 704 separates the bottom electrode layer 710 from the inter-layer or intermetal dielectric substrate 702. A device layer 720 is stacked on the bottom electrode layer 710. The device layer 720 may include multiple layers such as, for example multiple magnetic layers separated by an insulating layer. After deposition of the device layer 720 the device layer 720 may be annealed in a magnetic field to set a polarization of a fixed layer in the MTJ. An etch hard mask 730 is stacked on the device layer 720 and a photoresist 732 is patterned on the etch hard mask 730. The pattern in the photoresist 732 is transferred into layers below the photoresist 732 stopping at the bottom electrode layer 710 to create MTJs 721, as seen in FIG. 7B.

Figure 7B:
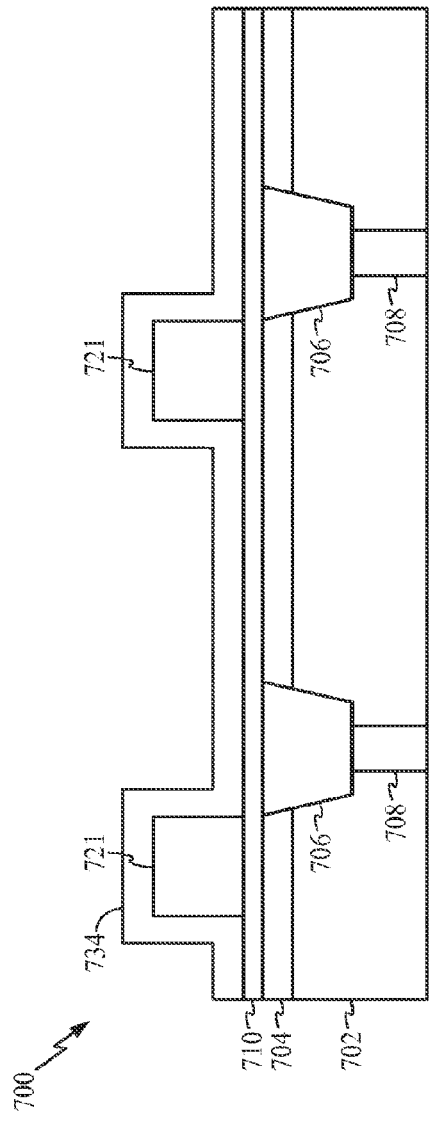

At block 610, a first capping layer 734 is deposited as shown in FIG. 7B. For example, the first capping layer 734 may be silicon carbide (SiC) film or a silicon nitride (SiN) film, and may be deposited without breaking vacuum after the pattern transfer, to protect the MTJs 721 from damage during future processing. In one case, the first capping layer 734 prevents oxidation of magnetic materials in the MTJs 721. An in-situ sputter process may clean the top and side surfaces of the MTJs 721 before the first capping layer 734 is deposited. For example, an Argon (Ar) sputter etch with a DC or an RF power supply bombards the MTJs 721 with Ar atoms, which physically remove contaminants from the surface of the MTJs 721.

Figure 7C:
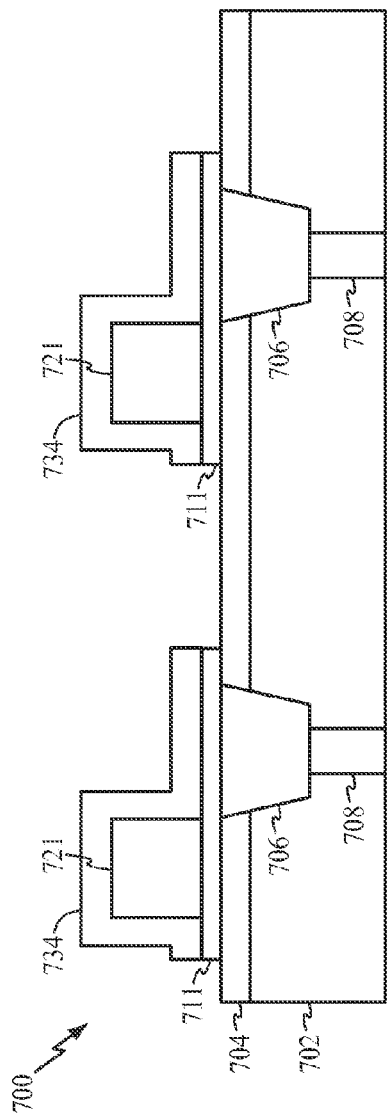

At block 615 the bottom electrode layer 710 and a first capping layer 734 are patterned, as seen in FIG. 7C. The patterned bottom electrode layer 710 forms discrete bottom electrodes 711. In one embodiment these bottom electrodes 711 may be individually addressable. After patterning of the bottom electrodes 711, a cleaning process cleans the wafer and remove any remaining photoresist materials and/or etch byproducts.

The bottom electrodes 711 are patterned earlier at a separate time during manufacturing than top electrodes (not yet shown). Patterning of the bottom electrodes 711 separate from the top electrode patterning reduces the aspect ratio for depositing dielectrics during manufacturing reducing the likelihood of gap formation and shorting of trenches (not yet shown).

Figure 7D:
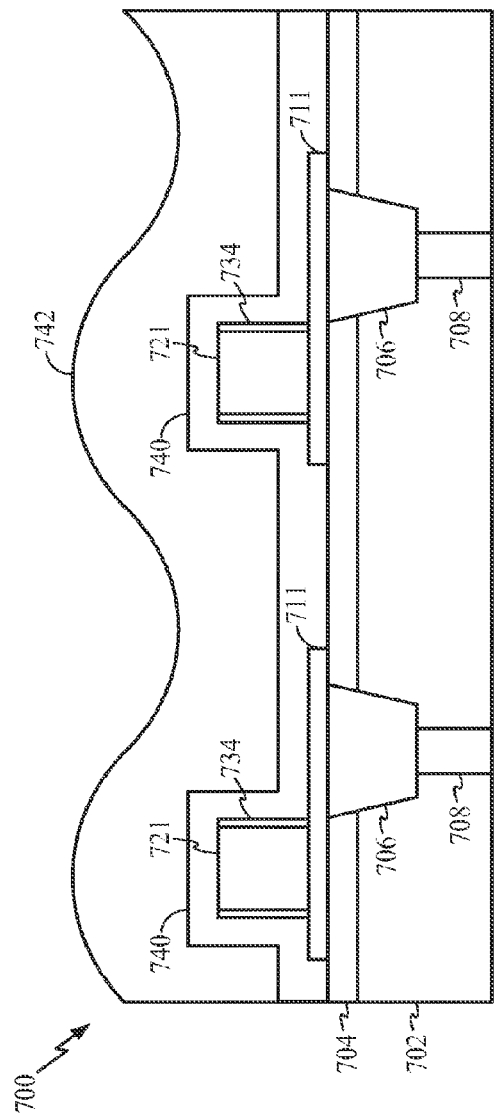

At block 620 the first capping layer 734 is etched back to remove the capping layer from the top of the MTJs 721. As seen in FIG. 7D, the first capping layer 734 remains on the sidewalk of the MTJs 721 after etch back in order to protect the sidewalk. According to one embodiment, the etch back is an oxygen free etch, preventing oxidation of metal materials in the MTJs 721. If however, oxidation occurs on the top metal surface, an etch process may remove the oxidation. A second capping layer 740 is deposited in-situ over the die and/or wafer including over the MTJs 721. The second capping layer 740 may be, for example, silicon nitride or silicon carbide. According to one embodiment, the second capping layer 740 is not the same material as the first capping layer 734.

Figure 7E:
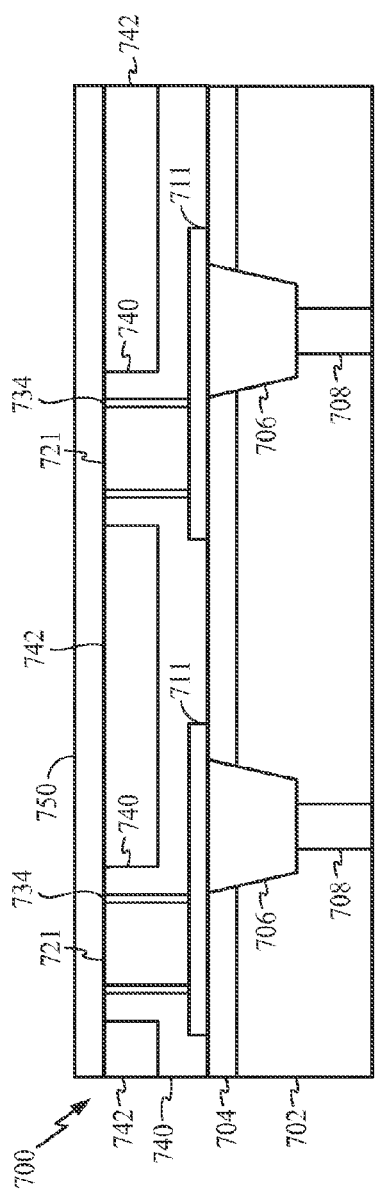

At block 625, inter-metal dielectric layer processing occurs. A intermediate inter-metal dielectric layer 742 is deposited on the die and/or wafer, as seen in FIG. 7D. The intermediate inter-metal dielectric layer 742 is etched back and planarized, with for example a chemical mechanical polishing, as seen in FIG. 7E. According to one embodiment, planarization includes etching the intermediate inter-metal dielectric layer 742 and the second capping layer 740 to be substantially level with the MTJs 721. In this case the top surface of the MTJs 721 are exposed for contact with a subsequent layer. In another embodiment, planarization only etches back the intermediate inter-metal dielectric layer 742. A subsequent spin on organic material and etch back then exposes the top surface of the MTJs 721. In yet another embodiment, an etch back process removes the first capping layer 734 and the second capping layer 740 from a portion of the side of the MTJs 721 depending upon location of the die and/or wafer to improve contact with the top electrode 750.

A sputter clean, as described earlier, may clean the top surface of the MTJs 721 in either of the previously mentioned embodiments for planarization. Presputter clean performed earlier in the process enlarges a process window by removing oxide from the MTJs 721.

After the top surface is exposed, a top electrode layer 750 is deposited on the die and/or wafer, which couples to the MTJs 721. The top electrode layer 750 is a conducting layer, such as tantalum, aluminum, or an alloy of metals. The top electrode layer 750 is flat after deposition because the intermediate inter-metal dielectric layer 742 below the top electrode layer 750 is also flat and lacks any voids.

Figure 7F:
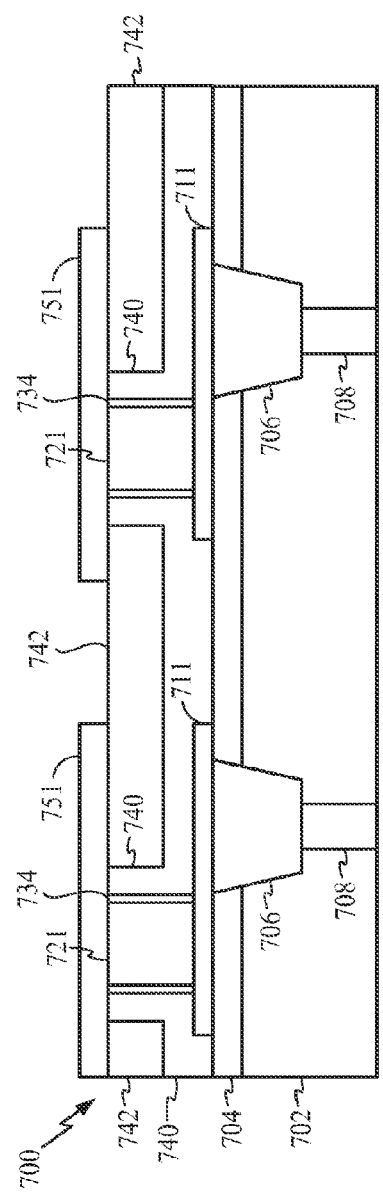

As seen in FIG. 7F, at block 630 the top electrode layer 750 is patterned to form discrete top electrodes 751. According to one embodiment, the mask for patterning the top electrodes 751 is the same mask that patterns the bottom electrodes 711, resulting in electrodes of substantially similar size.

At block 635, vias 762 and trenches 764 are fabricated to the top electrodes 751. FIG. 7G illustrates one embodiment of the electrical path. A top inter-metal dielectric layer 760 is deposited on the wafer and/or die. Planarization of the top inter-metal dielectric layer 760 obtains a substantially flat surface. In one embodiment, planarization employs chemical mechanical polishing processes.

After planarization, the top inter-metal dielectric layer 760 is patterned to form vias 762 and trenches 764 for connecting with the top electrodes 751. After patterning the top inter-metal dielectric layer 760, a sputter clean and/or wet clean removes remaining contaminants or polymers from a top surface of the top electrodes 751.

The vias 762 and the trenches 764 are filled with a conducting material to create a top conductor. For example, copper (Cu) may be electroplated to fill the vias and trenches. The electrodeposited copper may be planarized using, for example, a chemical mechanical polishing process. After deposition of the conducting material a capping film (not shown) may be deposited on the wafer and/or die.

In another embodiment illustrated in FIG. 7H, no via is patterned in the top inter-metal dielectric layer 760. Instead, the trenches 764 exposes contact to the top electrodes 751. In this embodiment, after etch of the trenches 764 a sputter clean and/or a wet etch removes polymer residue from the top electrodes 751.

During processing of the electronic devices as described above, the top electrode is etched in a separate process than etching of the bottom electrode. Using the exemplary manufacturing process described above reduces the likelihood of voids forming between electronic devices. As a result, process yield is improved because the risk of shorting trenches is reduced or eliminated.

Not only does the exemplary manufacturing process for arrays of electronic devices, such as MTJs, disclosed above reduce void filling issues that short electrical paths to the MTJs, but the process also results in a flat top electrode surface, improving contact with the top electrode. The bottom electrode is etched in a separate process from the top electrode, although the same mask may pattern both the top and bottom electrodes.

Although the present disclosure and its advantages have been described in detail, it should be understood that various changes, substitutions and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A electronic device manufacturing process, comprising: depositing a first electrode layer; fabricating a magnetic device on the first electrode layer; depositing a first capping layer on the magnetic device after fabricating the magnetic device; etching the first capping layer to expose a surface of the magnetic device after depositing the first capping layer; patterning the first electrode after fabricating the magnetic device; depositing a first dielectric layer after patterning the first electrode; depositing a second capping layer after etching the first capping layer and before depositing the first dielectric; depositing a second electrode layer on the first dielectric layer and on the magnetic device after depositing the first dielectric layer; and patterning the second electrode layer after depositing the second electrode layer.

2. The method of claim 1, in which the magnetic device comprises a magnetic tunnel junction.

3. The method of claim 2, further comprising integrating the magnetic tunnel junction into a magnetic random access memory.

4. The method of claim 1, further comprises planarizing the first dielectric layer before depositing the second electrode layer.

5. The method of claim 1, further comprising:
depositing a second dielectric layer after patterning the second electrode layer; and
planarizing the second dielectric layer.

6. The method of claim 5, further comprising:
patterning an electrical path to the second electrode layer after depositing the second dielectric layer; and
filling the electrical path with a conductive material.

7. The method of claim 6, in which patterning the electrical path comprises patterning a trench.

8. The method of claim 7, in which patterning the electrical path further comprises patterning a via.

9. The method of claim 6, further comprising depositing a third capping layer after filling the electrical path.

10. The method of claim 1, in which a same mask produces patterns for patterning the second electrode layer and patterning the first electrode layer.

11. The method of claim 1, further comprising:
cleaning the magnetic device after fabricating the magnetic device and before depositing the first dielectric layer; and
depositing a third capping layer on the magnetic device after cleaning the magnetic device.

12. The method of claim 1, further comprising integrating the magnetic device in at least one of a set top box, music player, video player, entertainment unit, navigation device, communications device, personal digital assistant (PDA), fixed location data unit, and a computer.

13. A method of manufacturing an electronic device comprising: a step for depositing a first electrode; a step for fabricating a magnetic device on the first electrode layer; a step for depositing a first capping layer on the magnetic device after the step for fabricating the magnetic device; a step for etching the first capping layer to expose a surface of the magnetic device after the step for depositing the first capping layer; a step for patterning the first electrode after the step for fabricating the magnetic device; a step for depositing a first dielectric layer after the step for patterning the first electrode; a step for depositing a second capping layer after the step for etching the first capping layer and before the step for depositing the first dielectric; a step for depositing a second electrode layer on the first dielectric layer and on the magnetic device after the step for depositing the first dielectric layer; and a step for patterning the second electrode layer after the step for depositing the second electrode layer.

14. The method of claim 13, in which the magnetic device comprises a magnetic tunnel junction.

15. The method of claim 13, further comprising:
    a step for depositing a second dielectric layer after the step for patterning the second electrode layer; and
    a step for planarizing the second dielectric layer;
    a step for patterning an electrical path to the second electrode layer after the step for depositing the second dielectric layer; and
    a step for filling the electrical path with a conductive material.

16. The method of claim 13, further comprising a step for integrating the magnetic device in at least one of a set top box, music player, video player, entertainment unit, navigation device, communications device, personal digital assistant (PDA), fixed location data unit, and a computer.

* * * * *